(12) United States Patent
Kang et al.

(10) Patent No.: US 9,240,239 B2
(45) Date of Patent: *Jan. 19, 2016

(54) NONVOLATILE MEMORY DEVICES AND DRIVING METHODS THEREOF

(71) Applicant: Samsung Electronics Co., Ltd., Suwon-Si, Gyeonggi-Do (KR)

(72) Inventors: Kyung-Hwa Kang, Seoul (KR); Sang-Wan Nam, Hwaseong-si (KR); Donghyuk Chae, Seoul (KR); ChiWeon Yoon, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/610,584

(22) Filed: Jan. 30, 2015

(65) Prior Publication Data
US 2015/0138890 A1      May 21, 2015

Related U.S. Application Data

(63) Continuation of application No. 13/368,769, filed on Feb. 8, 2012, now Pat. No. 8,971,114.

(30) Foreign Application Priority Data

Feb. 9, 2011    (KR) .................. 10-2011-0011608

(51) Int. Cl.
| | |
|---|---|
| *G11C 11/34* | (2006.01) |
| *G11C 16/04* | (2006.01) |
| *G11C 16/08* | (2006.01) |
| *H01L 27/115* | (2006.01) |

(52) U.S. Cl.
CPC ............. *G11C 16/08* (2013.01); *G11C 16/0466* (2013.01); *G11C 16/0483* (2013.01); *H01L 27/1157* (2013.01); *H01L 27/11582* (2013.01)

(58) Field of Classification Search
CPC ............... G11C 16/08; G11C 16/0483; H01L 27/1157; H01L 27/11582
USPC ............. 365/185.11, 185.12, 185.17, 185.23, 365/185.25
See application file for complete search history.

(56) References Cited

U.S. PATENT DOCUMENTS

| | | | |
|---|---|---|---|
| 7,075,824 B2 | 7/2006 | Park | |
| 7,646,664 B2 | 1/2010 | Cho et al. | |
| 8,059,461 B2 | 11/2011 | Lee | |
| 8,072,816 B2 | 12/2011 | Han et al. | |
| 8,432,739 B2 | 4/2013 | Park | |
| 8,971,114 B2 * | 3/2015 | Kang et al. | ............ 365/185.11 |
| 2005/0254303 A1 | 11/2005 | Park | |
| 2008/0084729 A1 | 4/2008 | Cho et al. | |

(Continued)

FOREIGN PATENT DOCUMENTS

| | | |
|---|---|---|
| JP | 2005328022 A | 11/2005 |
| JP | 2010161199 A | 7/2010 |
| KR | 100582422 B1 | 11/2005 |

(Continued)

*Primary Examiner* — Toan Le

(74) *Attorney, Agent, or Firm* — Harness, Dickey & Pierce, P.L.C.

(57) ABSTRACT

Nonvolatile memory devices including memory cell arrays with a plurality of cell strings connected between a substrate and a plurality of bit lines and selected by selection lines, and a gating circuit configured to drive the selection lines in at least two directions.

20 Claims, 13 Drawing Sheets

(56) References Cited

U.S. PATENT DOCUMENTS

2009/0185422 A1    7/2009   Kang et al.
2010/0172189 A1    7/2010   Itagaki et al.

FOREIGN PATENT DOCUMENTS

| KR | 100928021 B1 | 4/2008 |
| KR | 20100082319 A | 7/2010 |

* cited by examiner

NONVOLATILE MEMORY DEVICES AND DRIVING METHODS THEREOF

CROSS-REFERENCE TO RELATED APPLICATION

This application is a Continuation Application of U.S. application Ser. No. 13/368,769, filed Feb. 8, 2012, which claims priority under 35 U.S.C §119, of Korean Patent Application No. 10-2011-0011608, filed Feb. 9, 2011, in the Korean Intellectual Property Office (KIPO), the entire contents of each of which are incorporated herein by reference.

BACKGROUND

1. Field

Example embodiments relate to semiconductor memory devices, and more particularly, to nonvolatile memory devices with a three-dimensional (3D) structure and methods of driving the 3D memory devices.

2. Description of the Related Art

A semiconductor memory device is a memory device which is fabricated using semiconductors such as silicon (Si), germanium (Ge), gallium arsenide (GaAs), indium phosphide (InP), and the like. Semiconductor memory devices are classified into volatile memory devices and nonvolatile memory devices.

The volatile memory devices may lose stored contents at power-off. The volatile memory devices include a static RAM (SRAM), a dynamic RAM (DRAM), a synchronous DRAM (SDRAM), and the like. The nonvolatile memory devices may retain stored contents even at power-off. The nonvolatile memory devices include a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), and the like. The flash memory device is roughly divided into a NOR type and a NAND type.

A semiconductor memory device with a three-dimensional array structure may be a device with improved semiconductor memory device integration density.

SUMMARY

According to example embodiments, a nonvolatile memory device includes a memory cell array including a plurality of cell strings connected between a substrate and a plurality of bit lines and selected by selection lines, and a gating circuit configured to drive the selection lines in at least two directions.

According to other example embodiments, a driving method of a nonvolatile memory device including a plurality of cell strings formed between a substrate and a plurality of bit lines in a direction crossing the substrate includes pre-charging a bit line corresponding to a selected one of the plurality of cell strings, and providing a selection signal to a selection line corresponding to the selected cell string. The selection signal is supplied to both ends of the selection line.

According to at least one example embodiment, a nonvolatile memory device includes a memory cell array including a plurality of cell strings, the plurality of cell strings connected between a substrate layer and a plurality of bit lines, and connected to selection lines and a gating circuit configured to drive the selection lines in at least two directions.

According to at least one example embodiment, a nonvolatile memory device includes a memory cell array, a voltage supply device and at least one selection line connected between the memory cell array and the voltage supply device, the voltage supply device connected to the selection line at a plurality of connection points.

According to at least one example embodiment, a method of driving a nonvolatile memory device includes pre-charging a bit line connected to a selected cell string of a plurality of cell strings, the plurality of cell strings connected between a substrate and a plurality of bit lines, providing at least one selection signal to at least one selection line connected to the selected cell string on a first side of the plurality of cell strings, and providing the at least one selection signal to the at least one selection line on a second side of the plurality of cell strings.

BRIEF DESCRIPTION OF THE DRAWINGS

Example embodiments will be more clearly understood from the following brief description taken in conjunction with the accompanying drawings.

FIG. 1 is a block diagram illustrating nonvolatile memory devices according to example embodiments;

FIG. 2 is a perspective diagram illustrating a memory cell array of FIG. 1 according to example embodiments;

FIG. 3 is a perspective view illustrating a memory block of FIG. 2;

FIG. 4 includes cross-sectional diagrams illustrating a three-dimensional cell string of FIG. 3;

FIG. 5 includes a cross-sectional diagram illustrating a part of a pillar;

FIG. 6 is a circuit diagram illustrating cell arrays, a first gating circuit, and a second gating circuit according to example embodiments;

FIG. 7 is a circuit diagram illustrating a first gating circuit;

FIG. 8 is a circuit diagram illustrating a second gating circuit according to example embodiments;

FIG. 9 is a diagram illustrating an equivalent circuit of a selection line driven only in one direction;

FIG. 10 is a diagram illustrating an equivalent circuit of a selection line driven in two directions;

FIG. 11 is a diagram illustrating selection line voltage variation according to example embodiments;

FIG. 12 is a block diagram illustrating memory systems according to example embodiments;

FIG. 13 is a block diagram illustrating applications of memory systems described with respect to FIG. 12; and FIG. 14 is a block diagram illustrating computing systems including memory systems described with respect to FIG. 13.

Figure 1:
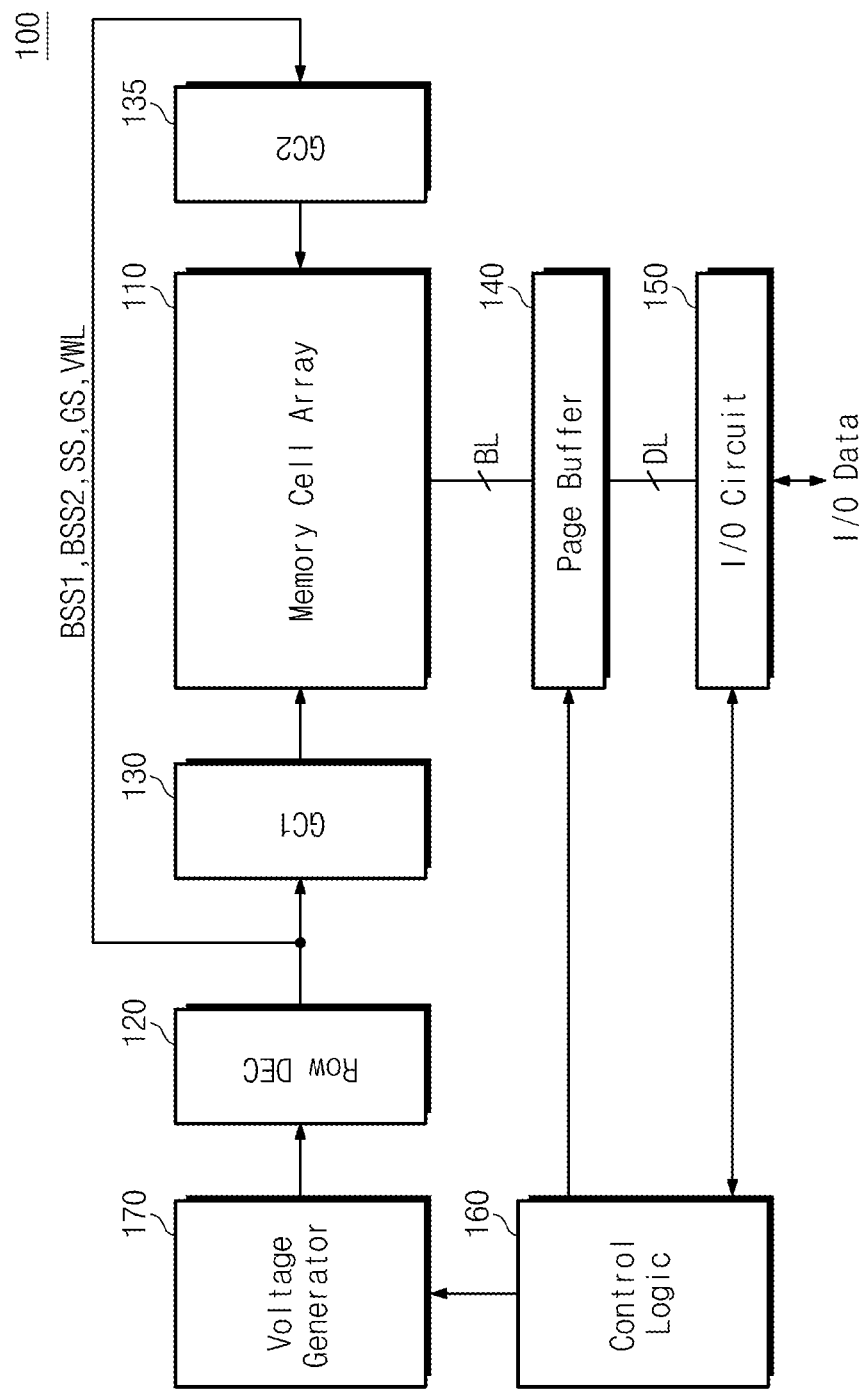
FIGS. 1-14 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be more fully described with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, thicknesses of layers and regions may be exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments of the inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example term "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of example embodiments of the inventive concept. As used herein, the singular forms "a", "an" and "the" are intended to include the plural forms as well, unless the context clearly indicates otherwise. It will be further understood that the terms "comprises", "comprising," "includes" and/or "including" if used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

A three-dimensional memory block has been proposed to improve the integration density of a nonvolatile memory device. In the three-dimensional memory block, it may be difficult to establish a setup speed of selection lines to be identical to that of word lines due to various factors. Non-uniform setup speeds of the selection lines may cause a decrease in the read margin and lowering of data reliability. Example embodiments of the inventive concepts may be described using a read operation of a nonvolatile memory device as an example. However, example embodiments of the inventive concepts may be applied to the read operation as well as various operations, for example, a program operation, an erase operation, and the like.

FIG. 1 is a block diagram illustrating nonvolatile memory devices according to example embodiments. Referring to FIG. 1, a nonvolatile memory device 100 may include a memory cell array 110, a row decoder 120, first and second gating circuits 130 and 135, a page buffer 140, an input/output circuit 150, control logic 160, and a voltage generator 170.

The memory cell array 110 may be connected with the row decoder 120 via the first and second gating circuits 130 and 135. The memory cell array 110 may be connected with the page buffer 140 via bit lines BL. The memory cell array 110 may include a plurality of memory cells. The memory cell array 110 may include a plurality of NAND cell strings. Each NAND cell string may include a channel formed in a vertical and/or horizontal direction. The memory cell array 110 may include word lines that may be stacked in a vertical direction. Each word line may form a control gate of a memory cell that may be included in a NAND cell string. A channel of a memory cell may be formed in a vertical direction (e.g., in a direction parallel with a cell string).

The row decoder 120 may select a memory block of the memory cell array 110 in response to a row address. The row decoder 120 may select a word line of the selected memory block. The row decoder 120 may be configured to generate block selection signals BSS1 and BSS2 for selecting a memory block. The first and second gating circuits 130 and 135 may transfer signals from the row decoder 120 to the memory cell array 110 in response to the block selection signal BSS1 and/or BSS2. The first and second gating circuits 130 and 135 may transfer a word line voltage VWL and selection signals SS and GS from the row decoder 120 to the memory cell array 110. If the block selection signal BSS1 is activated, the first gating circuit 130 may transfer the word line voltage VWL and the selection signals SS and GS to the memory cell array 110. If the block selection signal BSS2 is activated, the second gating circuit 135 may transfer the selection signals SS and GS to selection lines SSL and GSL of the memory cell array 110.

The first gating circuit 130 may be connected with one end of the selection lines SSL and GSL (see FIG. 11) of the memory cell array 110, and the second gating circuit 135 may be connected with the other ends of the selection lines SSL and GSL of the memory cell array 110. The selection lines SSL and GSL may be supplied with the selection signals from the first and second gating circuits 130 and 135. The selection lines SSL and GSL of the memory cell array 110 may be driven by the first and second gating circuits 130 and 135 at both sides. Loads of the selection lines SSL and GSL may be distributed to the first and second gating circuits 130 and 135. For example, a time constant ($\tau$=RC) may be reduced by reducing effective resistance and coupling capacitance of selection lines that may be driven by the first and second gating circuits 130 and 135. It may be possible to effectively increase a setup speed of the selection signals SS and GS that may be applied to the selection lines SSL and GSL.

The first gating circuit 130 may transfer the word line voltage VWL provided from the voltage generator 170 to a selected word line of the memory cell array 110. For example, in a read mode of a read operation and/or verify operation, the first gating circuit 130 may provide a selected word line with a selection read voltage Vrd (see FIG. 11) and an unselected word line with a non-selection read voltage Vread (see FIG. 11). The page buffer 140 may operate a write driver and/or a sense amplifier according to a mode of operation. In a program operation, the page buffer 140 may transfer a voltage corresponding to program data to a bit line of the memory cell array 110 in which cell strings may be formed to have a vertical structure. In a read operation, the page buffer 140 may read data from a selected memory cell to output it to the input/output circuit 150.

The input/output circuit 150 may transfer input data to the page buffer 140 via a data line DL and/or may output data provided from the page buffer 140 to an external device. The input/output circuit 150 may input addresses and/or commands (not shown) to the control logic 160 or the row decoder 120. The control logic 160 may control an overall operation (e.g., programming, reading and/or erasing) in response to a command from the input/output circuit 150. The control logic 160 may control the voltage generator 170 generate a selection read voltage Vrd, a non-selection read voltage Vread, and selection line voltages VSSL and VGSL (see FIG. 11) at a read operation. The control logic 160 may control the page buffer 140 so that it may sense data via the bit lines BL.

The voltage generator 170 may generate word line voltages that may be supplied to word lines and a voltage that may be supplied to a bulk (e.g., a well region) where memory cells may be formed, according to the control of the control logic 160. The word line voltages may include a program voltage, a pass voltage, a selection read voltage Vrd, and a non-selection read voltage Vread, for example. The voltage generator 170 may generate the selection line voltages VSSL and VGSL that may be provided to the selection lines SSL and GSL at read and/or program operations. The nonvolatile memory device 100 according to an example embodiment of the inventive concepts may be configured to drive both ends of the selection lines via the first and second gating circuits 130 and 135. It may be possible to improve a setup speed of the selection lines SSL and GSL of the three-dimensional memory cell array 110. This may improve the read margin of the nonvolatile memory device 100.

In FIG. 1, there is an example description of a case where the selection lines SSL and GSL may be driven at both sides. However, example embodiments are not limited thereto. For example, a part or all of the selection lines SSL and GSL may be driven at three or more directions via an additional gating circuit(s).

Figure 2:
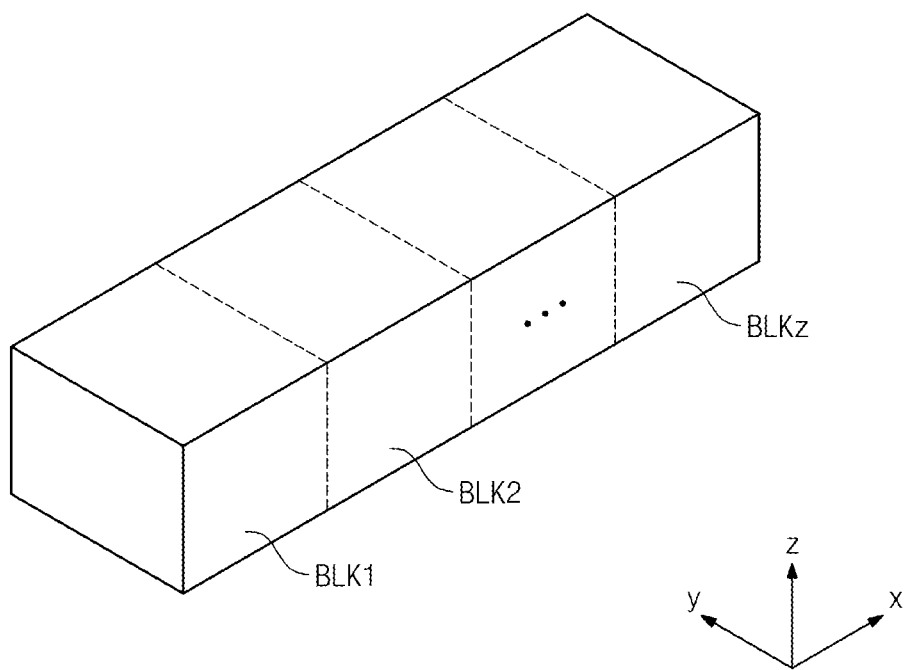

FIG. 2 is a perspective diagram illustrating a memory cell array of FIG. 1 according to example embodiments. Referring to FIGS. 1 and 2, a memory cell array 110 may include a plurality of memory blocks BLK1, BLK2 . . . BLKz, each of which may be formed to have a three-dimensional structure (e.g., a vertical structure). For example, each of the memory blocks BLK1-BLKz may include structures extending along the first to third directions x, y, and z. Each of the memory blocks BLK1-BLKz may include a plurality of NAND cell strings that may extend along the third direction.

Each cell string may be coupled with a bit line, a string selection line, a plurality of word lines, a ground selection line, and a common source line. Each memory block may be connected with a plurality of bit lines BL, a plurality of string selection lines SSL, a plurality of ground selection lines GSL, a plurality of word lines WL, and a common source line. According to at least one example embodiment, the plurality of memory blocks BLK1-BLKz may be selected by the first and second gating circuits 130 and 135 in FIG. 1. As a decoding result of a row address, there may be selected a memory block where a block selection signal BBS1 may be activated.

Figure 3:
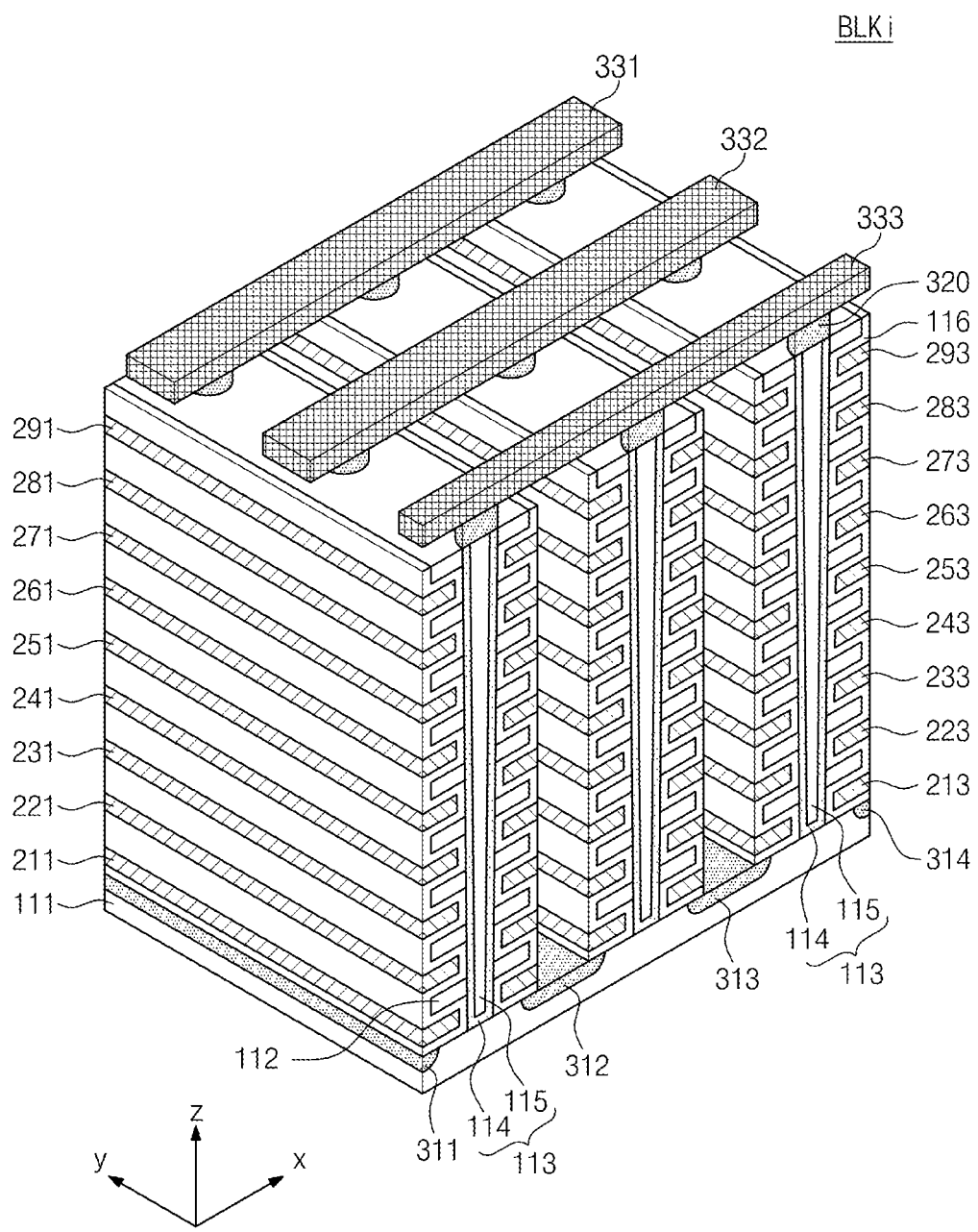

FIG. 3 is a perspective view illustrating a memory block of FIG. 2. Referring to FIG. 3, a memory block BLKi may include structures extending along the first to third directions x, y, and z. A substrate 111 may be part of the memory block BLKi. The substrate 111 may be, for example, a p-well in which a Group III element (e.g., boron) may be injected. According to at least one example embodiment, the substrate 111 may be, for example, a pocket p-well. The substrate 111 may include an n-well surrounding the pocket p-well. For purposes of explaining example embodiments, it may be assumed that the substrate 111 is a p-well. However, the substrate 111 is not be limited to a p-well.

Doping regions 311-314 that extend along the first direction (e.g., the x direction) may be in the substrate 111. The first to fourth doping regions 311-314 may be n-type conductive material and may be different from that of the substrate 111. For purposes of explanation, it may be assumed that the first to third doping regions 311-314 are n-type. However, the first to fourth doping regions 311-314 may not be limited to n-type. On the substrate 111 between the first and second doping regions 311 and 312, a plurality of insulation materials 112 that extend along the first direction may be provided sequentially along the third direction (e.g., the z direction). The insulation materials 112 may be spaced apart along the third direction. For example, the insulation materials 112 may include an insulation material (e.g., a silicon oxide).

On the substrate 111 between the first and second doping regions 311 and 312, a plurality of pillars 113 may be arranged along the second direction (e.g., the y direction) and may penetrate the plurality of insulation materials 112 along the third direction. For example, the pillars 113 may contact the substrate 111 through the insulation materials 112. The pillar 113 may be formed on the substrate 111 between the second and third doping regions 312 and 313 as well as on the substrate between third and fourth doping regions 313 and 314.

The pillars 113 may each be formed of a plurality of materials. For example, a surface layer 114 of each pillar 113 may include a semiconductor material (e.g., silicon) doped by a first conductive type dopant. For example, the surface layer 114 of each pillar 113 may include a silicon material doped to be the same conductive type as the substrate 111. For purposes of explaining example embodiments, it may be assumed that the surface layer 114 of each pillar 113 may include p-type silicon. However, the surface layer 114 of each pillar 113 is not limited to p-type silicon.

An inner layer 115 of each pillar 113 may be an insulation material. For example, the inner layer 115 of each pillar 113 may include a silicon oxide. For example, the inner layer 115 of each pillar 113 may include an air gap. An insulation film 116 may be provided between the first and second doping regions 311 and 312 along exposed surfaces of the insulation materials 112, the pillars 113, and the substrate 111. According to at least one example embodiment, the insulation film 116 on an exposed surface (toward the third direction z) of the last insulation material 112 provided along the third direction may be removed.

According to at least one example embodiment, a thickness of the insulation film 116 may be less than half a distance between the insulation materials 112. An area for including another material other than the insulation materials 112 and the insulation film 116 may be between an insulation film 116 that may be provided at a lower surface of the first insulation material of the insulation materials 112 and an insulation film 116 at an upper surface of the second insulation material placed below the first insulation material.

Between the first and second doping regions 311 and 312, the first conductive materials 211, 221, 231, 241, 251, 261, 271, 281 and 291 may be on an exposed surface of the insulation film 116. For example, the first conductive material 211 that may extend along the second direction may be between the substrate 111 and an insulation material 112 adjacent to the substrate 111. The first conductive material 211 that may extend along the first direction may be between the substrate 111, the insulation film 116, and upper and lower surfaces (e.g., opposing sidewalls) of the insulation material 112 adjacent to the substrate 111 and the insulation film 116. For example, along the third direction, there may be sequentially the substrate 111, a first section of the insulation film 116, the first conductive material 211, a second section of the insulation film 116, and the insulation material 112. The insulation film 116 may separate the first conductive material 211 from the insulation material 112 and the substrate.

According to at least one example embodiment, conductive materials 221, 231, 241, 251, 261, 271 and 281 that may extend along the first direction may be between the insulation materials 112. A conductive material 291 that may extend along the first direction may be at an area on the insulation materials 112. The conductive materials 211-291 that may extend along the first direction may be a metallic material. The conductive materials 211-291 that may extend along the first direction may be a conductive material, for example, polysilicon.

The same or similar structure as that on the first and second doping regions 311 and 312 may be provided at an area between the second and third doping regions 312 and 313. For example, at an area between the second and third doping regions 312 and 313, there may be a plurality of insulation materials 112 that may extend in the first direction, a plurality of pillars 113 that may be along the first direction and that penetrate the insulation materials 113 along the third direction, an insulation film 116 that may be on exposed surfaces of the plurality of pillars 113, and conductive materials that may extend along the first direction.

The same or similar structure as that on the first and second doping regions 311 and 312 may be at an area between the third and fourth doping regions 313 and 314. For example, at an area between the third and fourth doping regions 313 and 314, there may be plurality of insulation materials 112 that may extend in the first direction, a plurality of pillars 113 that may be along the first direction and that penetrate the insulation materials 113 along the third direction, an insulation film 116 that may be on exposed surfaces of the plurality of pillars 113, and conductive materials 213, 223, 233, 243, 253, 263, 273, 283, and 293 that may extend along the first direction. Although example embodiments are described to include a number of each of the various elements (e.g., 9 conductive materials), example embodiments include various numbers of each element according to, for example, design.

Drains 320 may be provided on the pillars 113. The drains 320 may be, for example, second conductivity type semiconductor materials. For example, the drains 320 may be n-type silicon materials. For purposes of explaining example embodiments, it may be assumed that the drains 320 may include n-type silicon materials. However, the drains 320 may not be limited to including n-type silicon materials. A width of each drain 320 may be wider than that of a corresponding pillar 113. Each drain 320 may be provided on an upper surface of a corresponding pillar 113 in a pad fashion.

Conductive materials 331, 332 and 333 that may extend along the first direction may be provided on the drains 320. The conductive materials 331-333 may be arranged along the second direction. The conductive materials 331-333 may be connected with corresponding drains 320. For example, the drains 320 and the conductive material 333 that may extend along the first direction may be connected via contact plugs. The conductive materials 331-333 that may extend along the first direction may be, for example, a metallic material. The conductive materials 331-333 that may extend along the first direction may be a conductive material, for example, including polysilicon.

Figure 4:
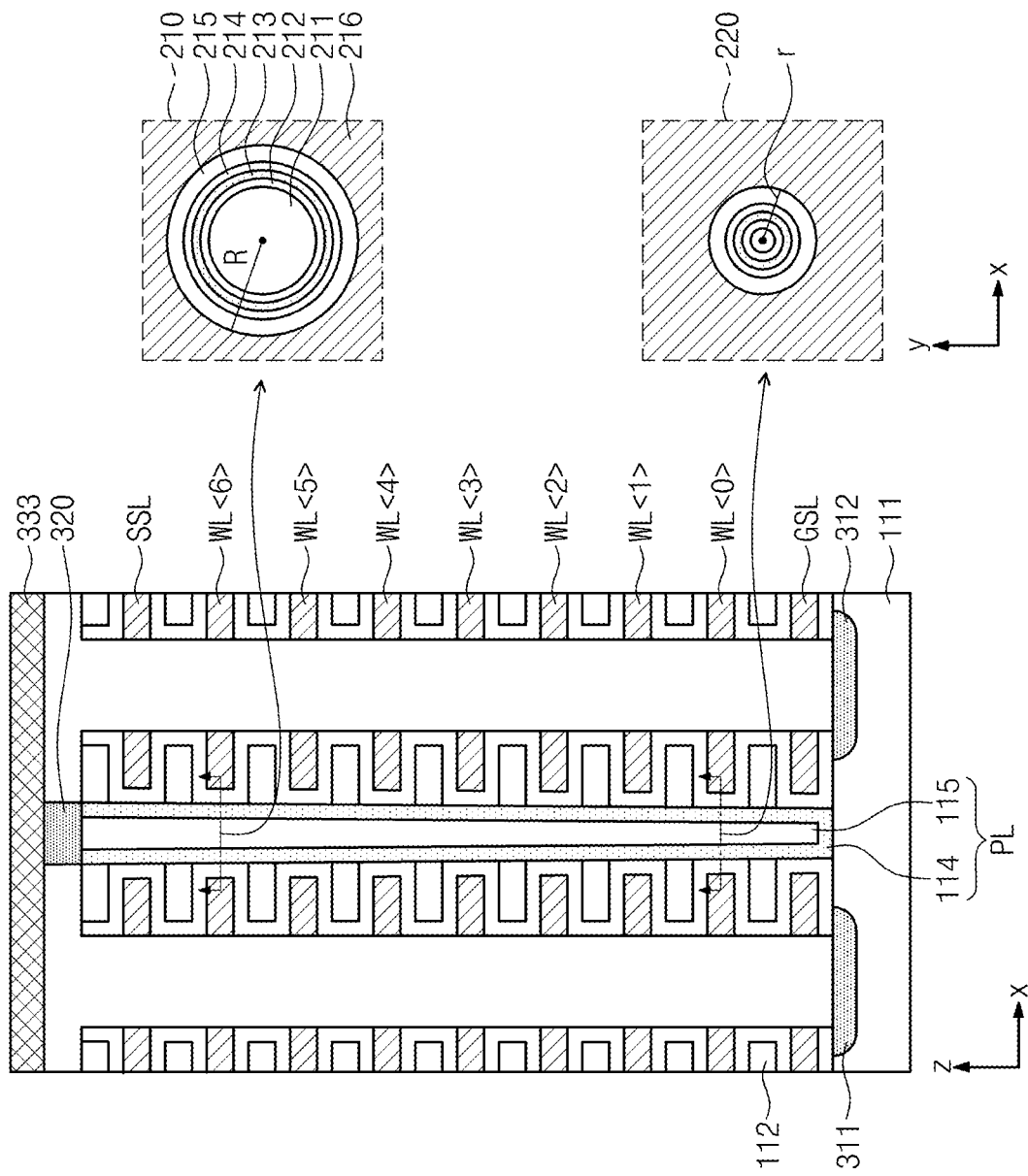

FIG. 4 includes cross-sectional diagrams illustrating a three-dimensional cell string of FIG. 3. Referring to FIG. 4, a cell string may include a plurality of memory cells which may be formed around a pillar PL that may be connected with a bit line 333. For ease of description, it may be assumed that a cell string may include seven memory cells, although example embodiments are not so limited. A pillar PL may be between the first and second doping regions 311 and 312, and may penetrate a plurality of insulation materials 112 along the third direction. The pillar PL may contact a substrate 111 through the insulation materials 112. The pillar PL may include a channel film 114 and an inner material 115.

The channel film 114 may include a semiconductor material (e.g., silicon) of the first conductive type. For example, the channel film 114 may include a semiconductor material (e.g., silicon) with the same conductive type as the substrate 111. For purposes of explaining example embodiments, it may be assumed that the channel film 114 is p-type silicon. However, example embodiments of the inventive concepts may not be limited thereto. For example, the channel film 114 may include an intrinsic semiconductor with a non-conductive characteristic. The inner material 115 may include an insulation material. For example, the inner material 115 may include a silicon oxide. For example, the inner material 115 may include air and may be an air gap.

Information storage films 116 may be on exposed surfaces of the insulation materials 112 and the pillar PL between the first and second doping regions 311 and 312. Conductive materials that are word lines WL<0>, WL<1>, WL<2>, WL<3>, WL<4>, WL<5> and WL<6> may be on exposed surfaces of the insulation storage films 116 between adjacent doping regions 311 and 312, and between a string selection line SSL (e.g., a conductive material) and a ground selection line GSL (e.g., a conductive material). The word lines WL<0> to WL<6> and the insulation materials 112 may be separated by word line cuts on the doping regions 311 and 312. According to at least one example embodiment, word lines WL<0> to WL<6> may include, for example, a metallic conductive material. The conductive materials may include, for example, a non-metallic conductive material (e.g., polysilicon).

A drain 320 may be formed on the pillar PL. According to at least one example embodiment, the drain 320 may include a semiconductor material (e.g., silicon) of the second conductive type. For example, the drain 320 may include an n-type semiconductor material (e.g., silicon). For purposes of explaining example embodiments, it may be assumed that the drain 320 is n-type silicon. However, example embodiments of the inventive concepts may not be limited thereto. According to at least one example embodiment, the drain 320 may extend toward a top of the channel film 114 of the pillar PL.

A bit line 333 that may be in the first direction may be on the drain 320. The bit line 333 may be connected with the drain 320. According to at least one example embodiment, the drain 320 and the bit line 333 may be interconnected via a contact plug (not shown). According to at least one example embodiment, the bit line 333 may include a metallic conductive material. According to at least one example embodiment, the bit line BL may include a non-metallic conductive material (e.g., polysilicon).

In FIG. 4, cross sections 210 and 220 may be placed at different locations of a cell string formed of a pillar PL. The cross section 210 may be a cross section of a cell string that may correspond to a plane where a word line WL<6> is located. The cross section 212 may be a cross section of a cell string that may correspond to a plane where a word line WL<0> may be located. A diameter of the pillar forming a channel of a cell string may vary according to depth.

A cell string may be formed by etching plural films at a time to form a hole and forming a silicon channel film in the hole. A radius R of a hole that may be formed via an etching process may vary according to depth. The deeper a depth may be, the less a radius R may be. A diameter (e.g., width) of a channel film that may correspond to the word line WL<6> may be greater than that of a channel film that may correspond to the word line WL<0>.

The cross section 210 of a cell string may correspond to a cell transistor that may be connected with the word line WL<6>. The cell transistor may include an inner layer 211, a channel layer 212, a tunnel oxide film 213, a charge storage layer 214, an insulation layer 215, and a conductive layer 216 that may correspond to a word line which may be formed sequentially from the interior. The inner layer 211 that may be formed as the innermost layer may be, for example, a silicon oxide and/or an air gap. The channel layer 212 may be formed of a p-type silicon layer and may operate as a channel of a cell transistor. The tunnel oxide layer 213 may operate as a tunneling insulation film through which charges may be moved by the tunneling effect.

The charge storage layer 214 may be formed of an insulation film for trapping charges. The charge storage layer 214 may be, for example, a silicon nitride (SiN) film and/or a metal (aluminum and/or hafnium) oxide film. The insulation film 215 may operate as an insulation film (e.g., a blocking layer) between the conductive layer 216 and the charge storage layer 214. The insulation film 215 may be, for example, a silicon oxide film. The conductive layer 216 may operate as a gate of a cell transistor. The tunnel oxide film 213, the charge storage layer 214, and the insulation layer 215 may be, as one example, an Oxide-Nitride-Oxide (ONO) structured insulation film.

The cross section 220 of a cell string may be of the same or similar structure as the cross section 210 except that a diameter of each film may be reduced. This phenomenon may be caused due to an etching depth difference (e.g., process variation due to aspect ratio). This may make a characteristic of a cell transistor connected with the word line WL<6> different from a cell transistor that may be connected with the word line WL<0>.

As a radius R of a pillar (e.g., filling the etched hole) becomes larger, an effective area of a conductive layer forming a gate may be reduced, which may increase resistance. Capacitance existing between films may increase. An increase in a radius R of a pillar may cause an increase in coupling capacitance and resistance of a cell transistor. A string selection transistor SST that may be placed at the uppermost layer of the pillar may have a maximum resistance and capacitance. This may force a time constant of a string selection line SSL to increase. A setup speed of the string selection line may be less than other cell transistors of a string.

Figure 5:
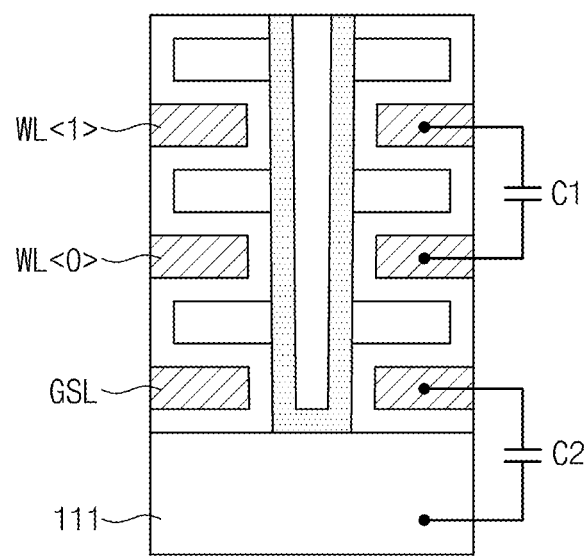

FIG. 5 includes a cross-sectional diagram illustrating a part of a pillar. Referring to FIG. 5, a ground selection line GSL may be a gate of a lowermost cell of a cell string. A diameter (e.g., horizontal width) of the ground selection line GSL may be less than those of word lines WL<0> and WL<1> that may be placed on the ground selection line GSL, and a distance from a substrate 111 may be closer as compared with the word lines WL<0> and WL<1>. The coupling capacitance C2 between a channel contact and a lower part of the ground selection line GSL may be larger as compared with a coupling capacitance C1 between word lines. A setup speed of a ground selection signal may become relatively slow due to the size of the capacitance C2 of the ground selection line GSL.

In the event that a setup speed of string and ground selection lines SSL and GSL is slower than that of word lines WL, a read margin may be reduced substantially. In the event that a setup speed of string and ground selection lines SSL and GSL may be slower than that of word lines WL, at a read operation, read voltages Vread and Vrd may be applied to word lines firstly. A channel may be boosted before selection signals may be applied to the selection lines SSL and GSL, that is, before selection transistors may be turned on. Afterwards, if the selection lines SSL and GSL may be set up by the selection signals, charges of a boosted channel may be leaked to a bit line BL and a common source line CSL. In this case, hot carriers may be injected to cell transistors adjacent to the selection transistors. As a result, threshold voltages of cell transistors adjacent to the selection transistors may increase unintentionally.

Figure 6:
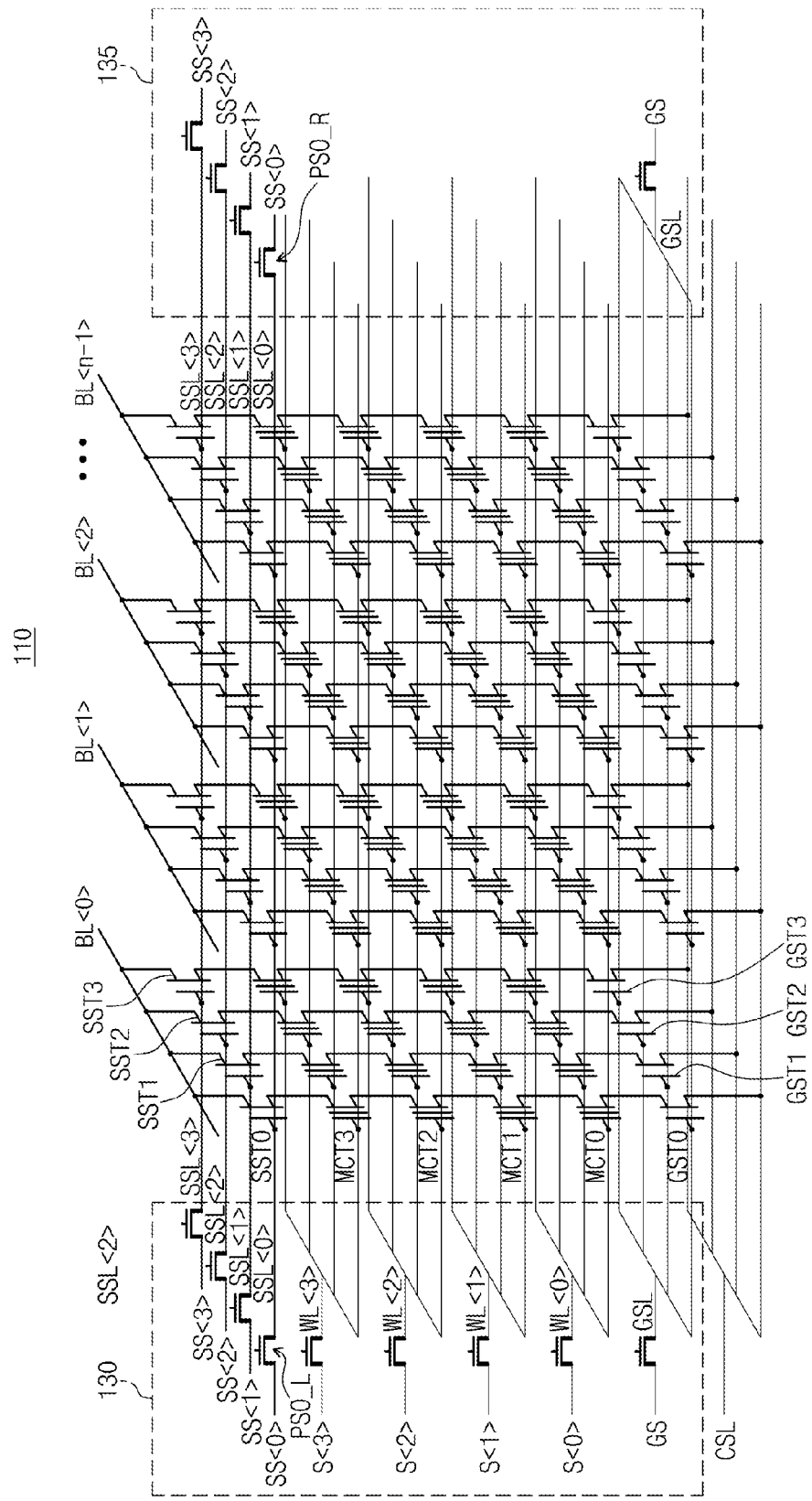

FIG. 6 is a circuit diagram illustrating cell arrays, a first gating circuit, and a second gating circuit according to example embodiments. Referring to FIG. 6, a cell array 110 may include bit lines BL<0>, BL<1>, BL<2> . . . BL<n-1> that may be on a top thereof along the second direction. The cell array 110 may include a common source line CSL which may be at a plane defined by the first and second directions x and y. Cell strings may be formed in the third direction z and between the bit lines BL<0> to BL<n-1> and the common source line CSL.

Each of cell strings connected with one of the bit lines BL<0> to BL<n-1> may include a string selection transistor SST (e.g., SST0, SST1, SST2 and SST3). Cell strings may be electrically connected to or disconnected from bit lines by the string selection transistors SST. Each of cell strings that may be connected with the bit lines BL<0> to BL<n-1> may further include a ground selection transistor GST (e.g., GST0, GST1, GST2 and GST3). A cell string may be selectively connected with the common source line CSL via a ground selection transistor GST. Memory cell transistors MCT (e.g., MCT0, MCT1, MCT2 and MCT3) may be connected in series between the string selection transistors SST and the ground selection transistors GST along the third direction.

In the cell array 110 according to at least one example embodiment, a word line WL may be connected in common with memory cell transistors formed at one layer. Each of word lines WL<0> to WL<3> may be connected in common with memory cell transistors of a corresponding layer. Memory cell transistors that may be formed at a layer may be supplied with the same word line voltage. At a read operation, a selection read voltage Vrd may be applied to a selected one of the word lines WL<0> to WL<3>, and a non-selection read voltage Vread may be applied to remaining unselected word lines.

String selection transistors SST that may be formed at one layer may be connected with string selection lines SSL<0> to SSL<3> to supply selection signals SS<0> to SS<3>. Ground selection transistors GST of the vertical string structured cell array 110 may be controlled at the same time to provide selection signal GS. Ground selection transistors GST included in one block may be controlled by one ground selection line GSL. Selection transistors SST and GST of the memory cell array 110 may be driven dually by the first and second gating circuits 130 and 135. Pass transistors PS0_L and PS0_R that may be placed at both ends of the string selection line SSL<0> may be turned on at the same time to supply a selection signal SS<0>. Loads of the string selection line SSL<0> may be distributed by the pass transistors PS0_L and PS0_R. This driving technique may be applicable to all string selection lines SSL<0> to SSL<m-1> and the ground selection line GSL.

Pass transistors for providing decoded word line voltages S<0> to S<3> to word lines of a selected block may constitute the first gating circuit 130. The decoded word line voltages S<0> to S<3> may be provided to one end of the word lines by the first gating circuit 130. Selection lines SSL and GSL may be driven dually at both sides via the first and second gating circuits 130 and 135. Although the selection lines SSL and GSL may have a relatively large time constant, a setup speed may be improved.

Figure 7:
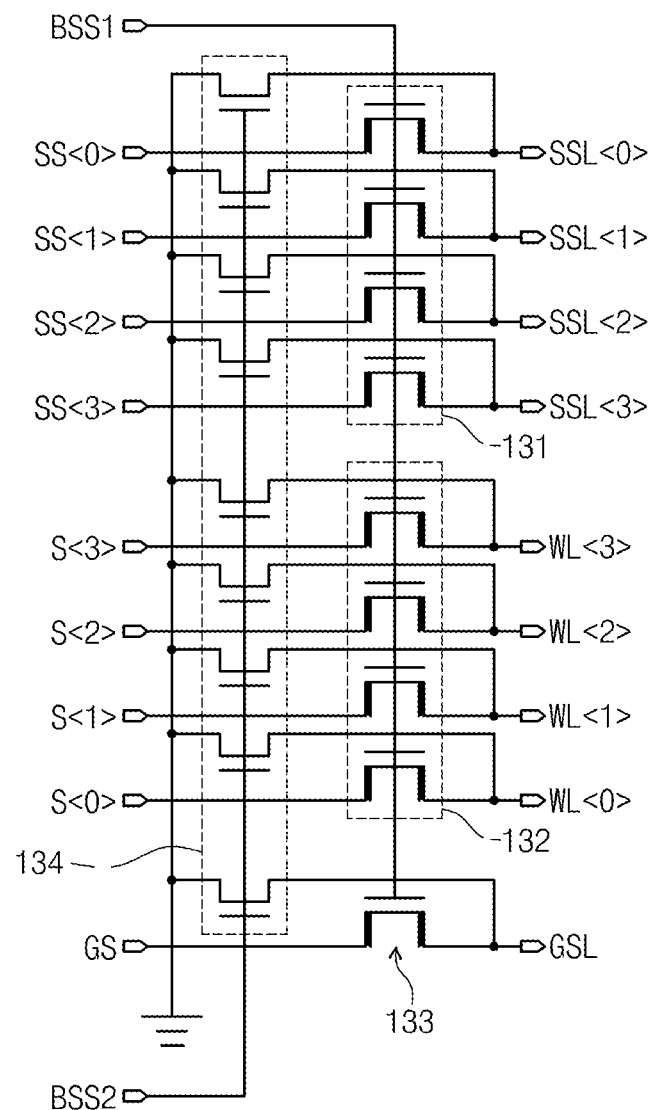

FIG. 7 is a circuit diagram illustrating a first gating circuit. Referring to FIG. 7, the first gating circuit 130 may provide decoded row selection signals SS<0> to SS<3>, S<0> to S<3>, and GS to a selected block. The first gating circuit 130 may include pass circuits 131, 132, and 133 and a ground circuit 134. The pass circuits 131, 132 and 133 may include pass transistors. The pass transistors may connect string selection lines SSL<0> to SSL<3>, word lines WL<0> to WL<3>, and a ground selection line GSL with string lines SS<0> to SS<3>, selection lines S<0> to S<3>, and a ground line GS in response to the first block selection signal BSS1. According to at least one example embodiment, the pass transistors may be a high voltage transistor.

The ground circuit 134 may include a plurality of ground transistors. The ground transistors may ground the string selection lines SSL<0> to SSL<3> and the ground selection line GSL in response to the second block selection signal BSS2. The second block selection signal BSS2 may be referred to as a block shut-off signal. An activated block selection signal BSS1 provided to the first and second gating circuits 130 and 135 may correspond to a selected memory block of a plurality of memory blocks BLK1-BLKz. The pass circuits 131, 132, and 133 may transfer signals provided to the string selection lines SSL<0> to SSL<3>, the word lines WL<0> to WL<3>, and the ground selection line GSL.

An activated second block selection signal BSS2 may be provided to the ground circuits that correspond to unselected memory blocks of a plurality of memory blocks BLK1-BLKz. The string selection lines SSL<0> to SSL<3>, the word lines WL<0> to WL<3>, and the ground selection line GSL of each of the unselected memory blocks may be supplied with a ground voltage VSS (see FIG. 11). Unselected memory blocks may be separated from bit lines BL and a common source line CSL.

An example word line structure is illustrated in FIG. 7 to describe example embodiments of the inventive concepts. A part of the memory cells that may be included at one layer may be connected with another word line being electrically isolated.

Figure 8:
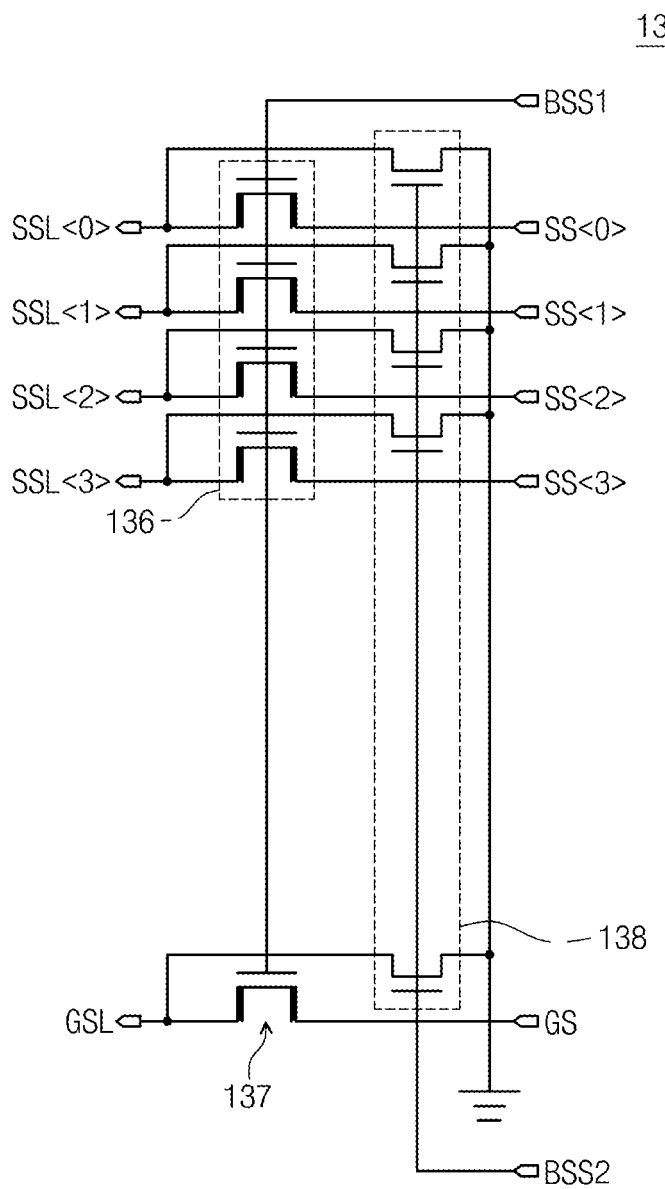

FIG. 8 is a circuit diagram illustrating a second gating circuit according to example embodiments. Referring to FIG. 8, the second gating circuit 135 may provide selection signals SS<0> to SS<3> and GS to a selected block. The second gating circuit 135 may include pass circuits 136 and 137 and a ground circuit 138. The pass circuits 136 and 137 may include pass transistors. The pass transistors may connect string selection lines SSL<0> to SSL<3> and a ground selection line GSL with string signals SS<0> to SS<3> and the ground line GS in response to the first block selection signal BSS1. According to at least one example embodiment, the pass transistors may be high voltage transistors.

The ground circuit 138 may include a plurality of ground transistors. The ground transistors may ground the string selection lines SSL<0> to SSL<3> and the ground selection line GSL in response to the second block selection signal BSS2. An activated block selection signal BSS1 may be provided to a pass circuit that may correspond to a selected memory block of a plurality of memory blocks BLK1-BLKz. An activated block selection signal BSS2 may be provided to ground circuits that may correspond to unselected memory blocks of the plurality of memory blocks BLK1-BLKz.

The first and second gating circuits 130 and 135 in FIGS. 7 and 8 are an example. Pass and ground circuits of the first and second gating circuits 130 and 135 may be modified or changed variously.

Figure 9:
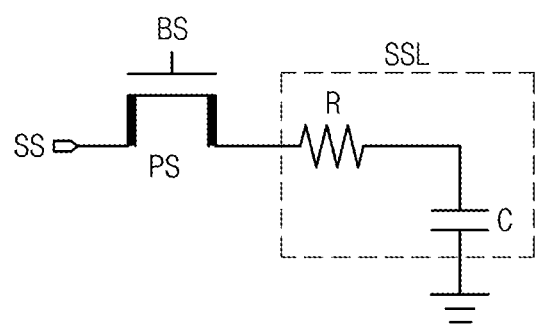

FIG. 9 is a diagram illustrating an equivalent circuit of a selection line driven only in one direction. Referring to FIG. 9, a string selection line SSL that may be supplied with a selection signal SS via one pass transistor PS may be modeled using a resistor R and a capacitor C. A ground selection line GSL may be also modeled the same as the string selection line SSL in FIG. 9. A selection signal BS may be provided to the pass transistor PS.

In a three-dimensionally structured cell string, string and ground selection lines SSL and GSL may have relatively large resistance and capacitance as compared with word lines. A speed of setting up the string selection line SSL with a selection signal SS may be reduced due to the large resistance and capacitance.

Figure 10:
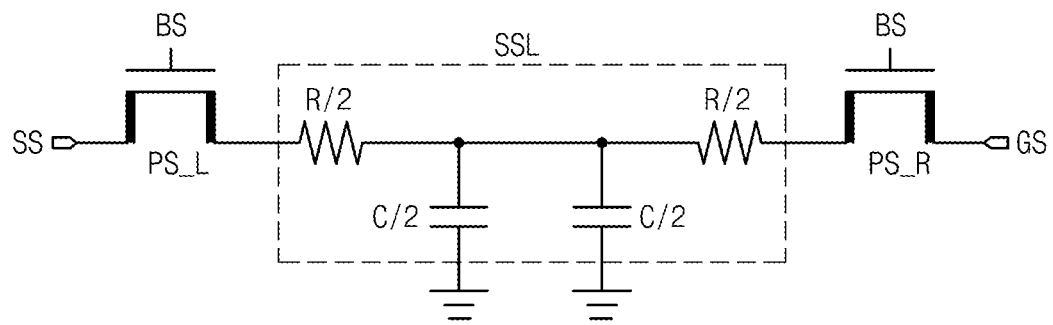

FIG. 10 is a diagram illustrating an equivalent circuit of a selection line driven in two directions. Referring to FIG. 10, the first and second pass transistors PS_L and PS_R may be connected at both ends of a string selection line SSL. A selection signal SS may be simultaneously provided to the string selection line SSL via the first and second pass transistors PS_L and PS_R. Loading R and C that may be charged by the first pass transistor PS_L may be halved without structural change of the string selection line SSL. Loading R and C that may be charged by the second pass transistor PS_R may be halved.

Accordingly, ideally, a time constant ($\tau$=RC) may be reduced by three quarters (to a quarter of a time constant of one selection line driven in one direction). Reduction of the time constant may mean an increase in a setup speed of a selection signal SS. Lowering of a setup speed on selection lines may be effectively compensated by the structure of the pass transistors PS_L and PS_R according to example embodiments of the inventive concepts.

Figure 11:
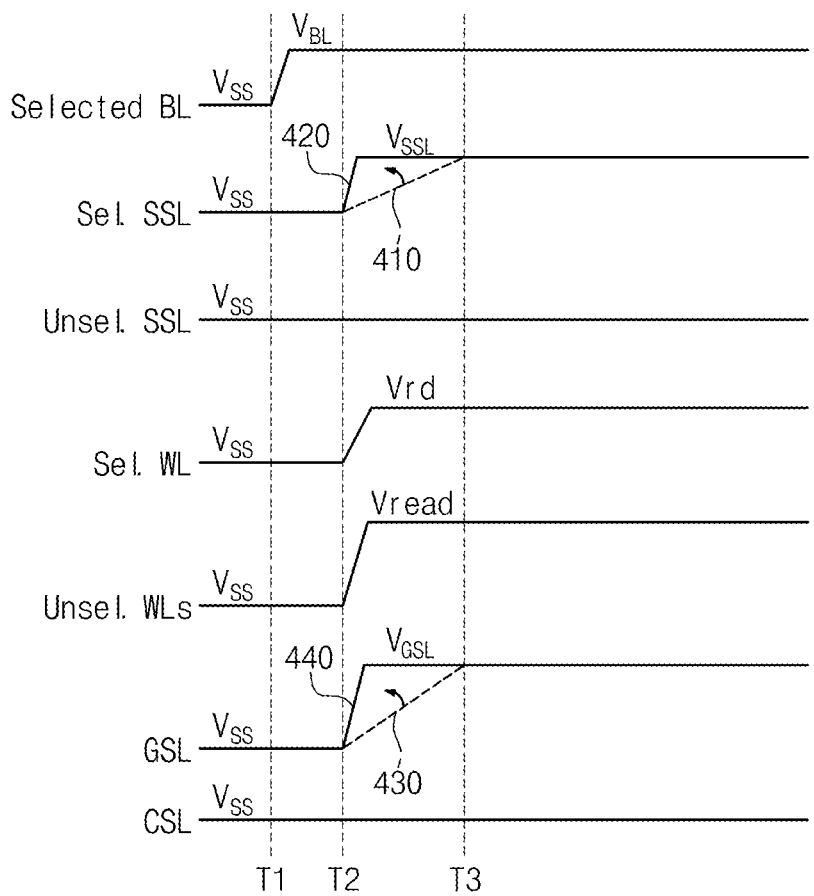

FIG. 11 is a diagram illustrating selection line voltage variation according to example embodiments. A setup speed of selection lines SSL and GSL may be improved via a gating structure according to example embodiments. For purposes of explanation, it may be assumed that pass circuits 131, 132, 133, 136 and 137 are in a turn-on state to read data of a selected memory block.

At T1, a selected bit line may be pre-charged with a bit line pre-charge voltage VBL to read data from a selected memory cell. At T2, a string selection voltage VSSL and a ground selection voltage VGSL may be applied to a selected string selection line and a ground selection line, respectively. A selection read voltage Vrd may be provided to a selected word line, and a non-selection read voltage Vread may be provided to unselected word lines. A common source line CSL and unselected string selection lines SSL may be grounded.

In case of a gating circuit structure according to example embodiments, a setup speed of the selected string selection line and the ground selection line may be speeded up as illustrated in FIG. 11. For example, in a case where a string selection line may be driven by one pass transistor at one side, it may be set up along a slope represented by a dotted line 410 due to a relatively large time constant and setup may not be completed until T3. In a case where a string selection line may be driven by two pass transistors at both sides, a time constant of the string selection line may be reduced. A setup speed of the string selection line may be improved as illustrated by a solid line 420.

This effect may be applicable to a ground selection line GSL. In a case where the ground selection line may be driven at one side, a slope of a setup voltage of the ground selection line may be formed as represented by a dotted line 430. In a case where the ground selection line may be driven at both sides, a slope of a setup voltage of the ground selection line may be bettered as represented by a solid line 440.

Figure 12:
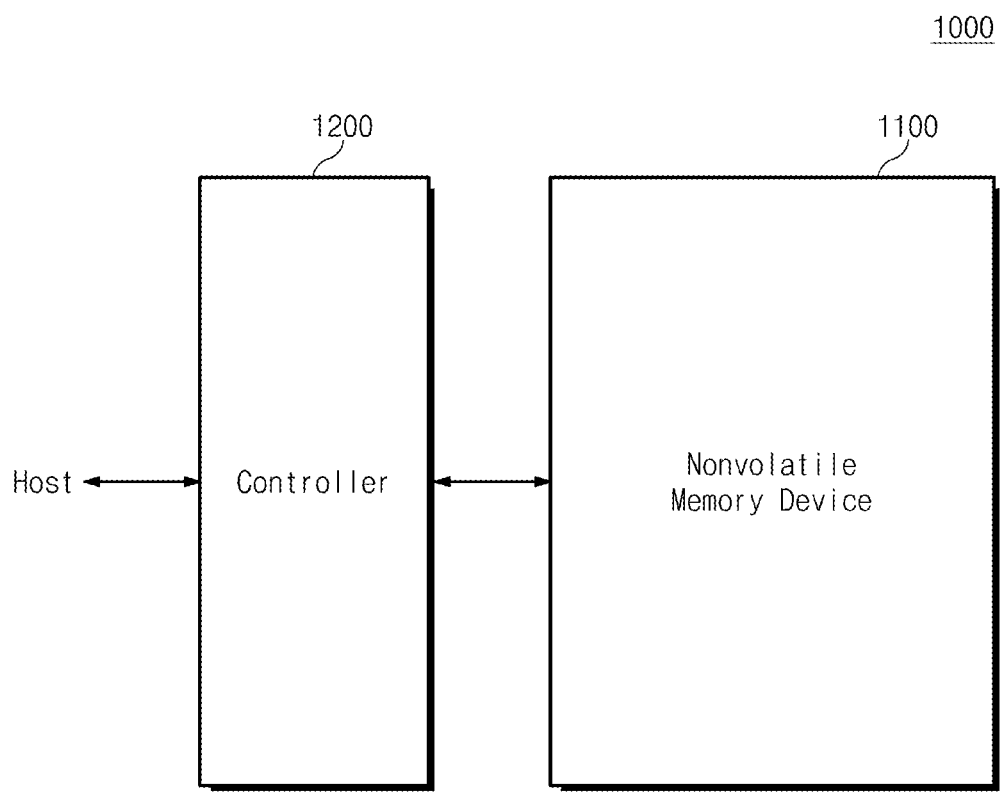

FIG. 12 is a block diagram illustrating memory systems according to example embodiments. Referring to FIG. 12, a memory system 1000 may include a nonvolatile memory device 1100 and a controller 1200. The nonvolatile memory device 1100 may be configured as according to example embodiments described with reference to FIGS. 1-8 and 10-11. The nonvolatile memory device 1100 may be configured to drive selection lines SSL and GSL at both sides of a memory cell array. It may be possible to improve a setup speed of the selection lines of a memory cell array. It may be possible to secure a read margin and to improve reliability by compensating for problems, for example, a read disturbance that may be caused by a setup speed of selection lines.

The controller 1200 may be coupled with a host and/or the nonvolatile memory device 1100. The controller 1200 may be configured to access the nonvolatile memory device 1100 in response to a request from the host. The controller 1200 may be configured to control read, program, erase, and/or perform background operations of the nonvolatile memory device 1100, for example. The controller 1200 may be configured to provide an interface between the nonvolatile memory portion 1100 and the host. The controller 1200 may be configured to drive firmware for controlling the nonvolatile memory portion 1100.

According to at least one example embodiment, the controller 1200 may further include a RAM, a processing unit, a host interface and/or a memory interface (not shown). The RAM may be used as at least one of a working memory of the processing unit, a cache memory between the nonvolatile memory portion 1100 and the host and/or a buffer memory between the nonvolatile memory portion 1100 and the host. The processing unit may control an overall operation of the controller 1200.

The host interface may include a protocol for executing data exchange between the host and the controller 1200. The controller 1200 may communicate with an external device (e.g., the host) via at least one of various protocols, for example, a USB (Universal Serial Bus) protocol, a MMC (multimedia card) protocol, a PCI (peripheral component interconnection) protocol, a PCI-E (PCI-express) protocol, an ATA (Advanced Technology Attachment) protocol, a Serial-ATA protocol, a Parallel-ATA protocol, a SCSI (small computer small interface) protocol, an ESDI (enhanced small disk interface) protocol, and/or an IDE (Integrated Drive Electronics) protocol. The memory interface may interface with the nonvolatile memory device 1100. The memory interface may include a NAND interface and/or a NOR interface.

The memory system 1000 may further include an ECC block (not shown). The ECC block may be configured to detect and/or correct an error of data read from the nonvolatile memory device 1100 that may use the ECC. The ECC block may be provided as an element of the controller 1200 and/or as an element of the nonvolatile memory device 1100.

The controller 1200 and the nonvolatile memory device 1100 may be integrated in a single semiconductor device. The controller 1200 and the nonvolatile memory device 1100 may be integrated in a single semiconductor device to be at least a part of, for example, a memory card. For example, the controller 1200 and the nonvolatile memory device 1100 may be integrated in a single semiconductor device to be a PC (PCM-CIA) card, a CF card, an SM (or, SMC) card, a memory stick, a multimedia card (MMC, RS-MMC, MMCmicro), a security card (SD, miniSD, microSD, SDHC), a universal flash storage (UFS) device, and/or the like. The controller 1200 and the nonvolatile memory device 1100 may be integrated in a single semiconductor device to be at least a part of, for example, a solid state drive (SSD). The SSD may include a storage device that may be configured to store data in a semiconductor memory. If the memory system 1000 is used as the SSD, it may be possible to improve an operating speed of a host that may be coupled with the memory system 1000.

According to at least one example embodiment, the memory system 1000 may be used by, for example, a computer, portable computer, Ultra Mobile PC (UMPC), workstation, net-book, PDA, web tablet, wireless phone, mobile phone, smart phone, e-book, PMP (portable multimedia player), digital camera, digital audio recorder/player, digital picture/video recorder/player, portable game machine, navigation system, black box, 3-dimensional television, a device that may be capable of transmitting and/or receiving information wirelessly, one of various electronic devices of a home network, one of various electronic devices of a computer network, one of various electronic devices of a telematics network, RFID, and/or one of various electronic devices of a computing system.

According to example embodiments, a nonvolatile memory device 1100 and/or a memory system 1000 may be packaged by various types of packages, for example, PoP (Package on Package), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and/or the like.

Figure 13:
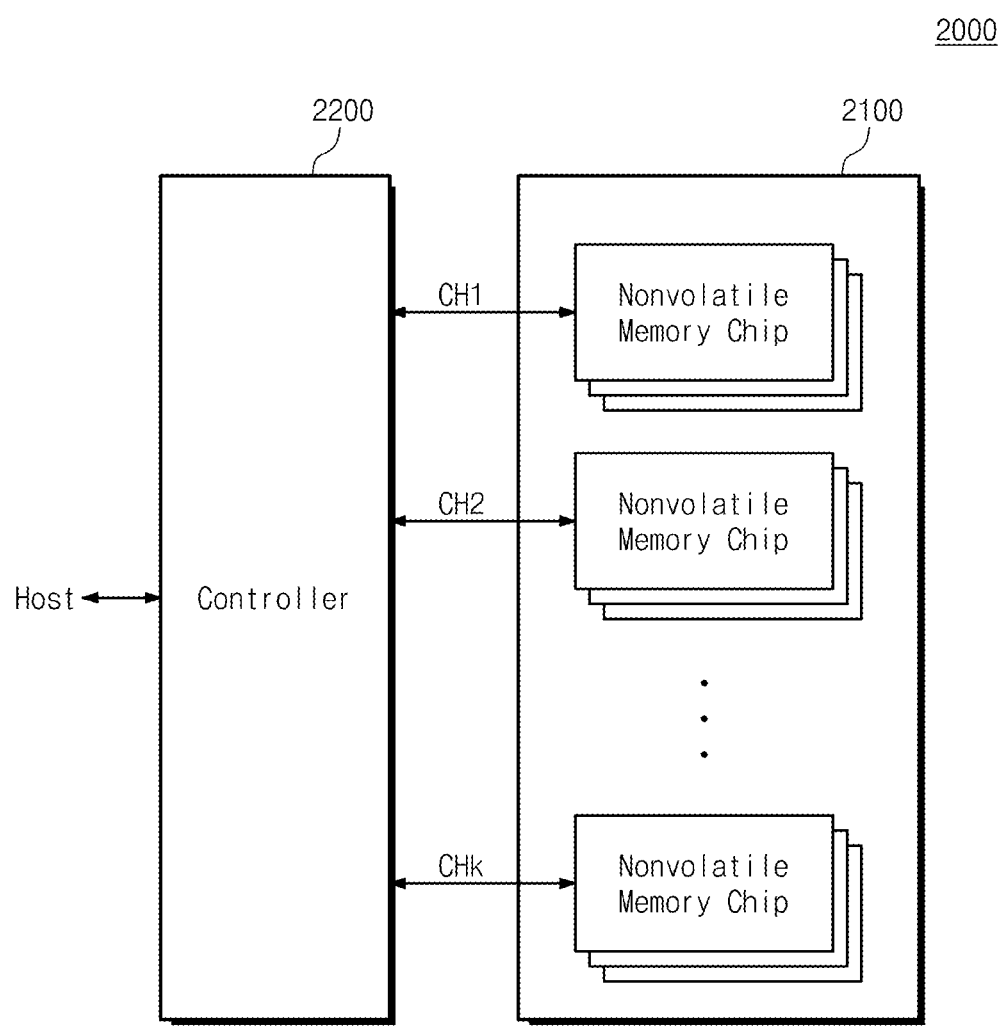

FIG. 13 is a block diagram illustrating applications of memory systems described with respect to FIG. 12. Referring to FIG. 13, a memory system 2000 may include a nonvolatile memory device 2100 and a controller 2200. The nonvolatile memory device 2100 may include a plurality of nonvolatile memory chips, which may be classified into a plurality of groups. Nonvolatile memory chips in each group may communicate with the controller 2200 via a common channel. In FIG. 13, there may be illustrated the case that a plurality of memory chips communicates with the controller 2200 via K channels CH1-CHk as one example. Each nonvolatile memory chip may be configured the same as a nonvolatile memory device 1100 described with reference to FIG. 12.

As illustrated in FIG. 13, one channel may be connected with a plurality of nonvolatile memory chips. The memory system 2000 may be modified such that one channel may be connected with one nonvolatile memory chip. Each nonvolatile memory chip may be configured to drive selection lines SSL and GSL at both sides of a memory cell array. It may be possible to improve a setup speed of the selection lines that may be formed at the memory cell array. It may be possible to secure a read margin and to improve reliability by compensating for problems, for example, such as the read, disturbances that may be caused by a setup speed of selection lines.

Figure 14:
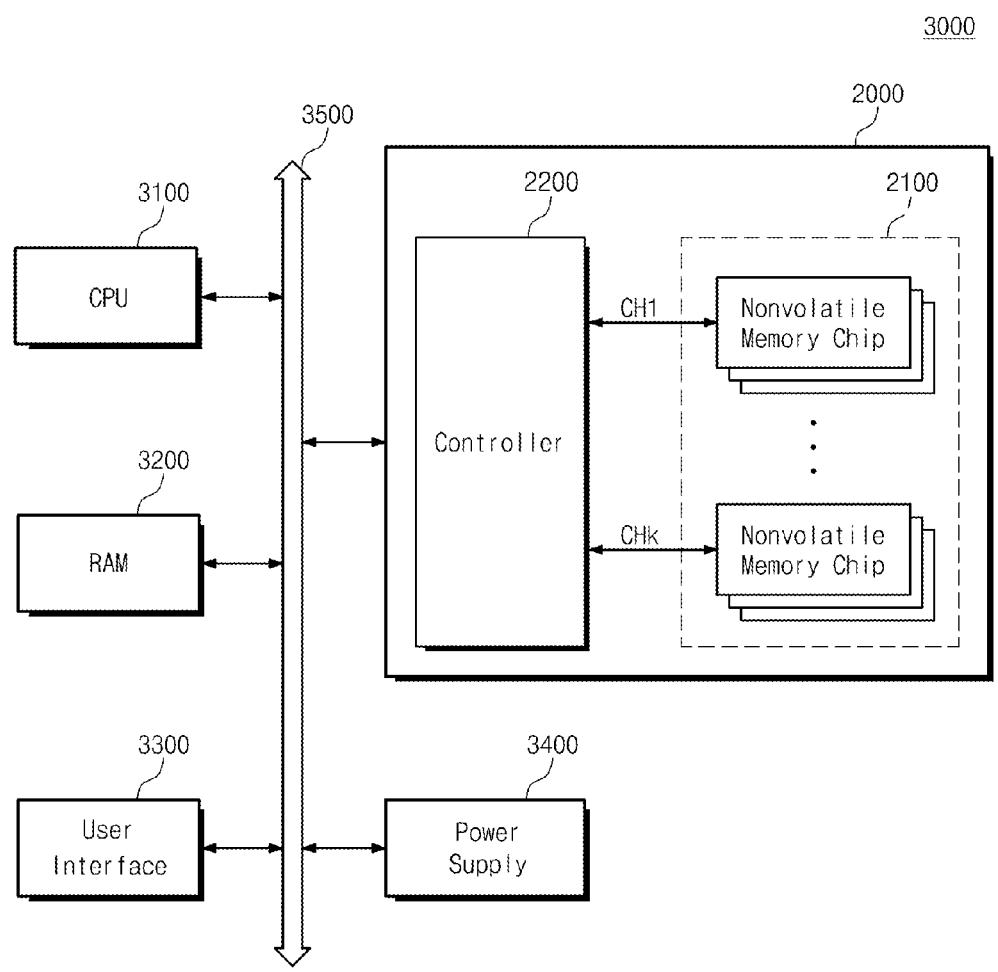

FIG. 14 is a block diagram illustrating computing systems including memory systems described with respect to FIG. 13. Referring to FIG. 14, a computing system 3000 may include a CPU 3100, a RAM 3200, a user interface 3300, a power supply 3400 and a memory system 2000. The memory system 2000 may be electrically connected with the CPU 3100, the RAM 3200, the user interface 3300, and/or the power supply 3400. Data provided via the user interface 3300 and/or processed by the CPU 3100 may be stored in the memory system 2000. Although not shown in figures, the computing system 3000 according to an example embodiment may include an application chipset, a camera image processor (CIS), a mobile DRAM and/or the like.

A nonvolatile memory device 2100 may be connected with a system bus 3500 via a controller 2200. According to at least one example embodiment, the nonvolatile memory device 2100 may be connected directly with the system bus 3500. The memory system 2000 in FIG. 14 may be a memory system described in FIG. 13. The computing system 3000 may operate reliably by using the nonvolatile memory device 2100 according to example embodiments. In the event that the nonvolatile memory device 2100 may be used as a mass storage device, the computing system 3000 may be a high and/or improved capacity, high and/or improved reliability, and high and/or improved performance computing system.

While example embodiments have been particularly shown and described, it will be understood by one of ordinary skill in the art that variations in form and detail may be made therein without departing from the spirit and scope of the claims.

What is claimed is:

1. A nonvolatile memory device, comprising:
   a memory cell array including a plurality of cell strings formed in a direction perpendicular to a substrate layer, each of the plurality of cell strings is connected between the substrate layer and a corresponding bit line, wherein each of the plurality of cell strings comprises,
   at least one string selection transistor connected to a string selection line,
   a plurality of cell transistors, each of the plurality of cell transistors connected in common with a word line of a corresponding layer, and
   at least one ground selection transistor connected to a ground selection line for connecting the plurality of cell transistors to the substrate layer; and
   a decoder configured to drive at least one of the string selection line and the ground selection line in at least two directions.

2. The nonvolatile memory device of claim 1, wherein the decoder comprises:
   a first gating circuit configured to provide at least one of a string selection signal to the string selection line, a ground selection signal to the ground selection line, and provide word line voltages to the plurality of word lines associated with the plurality of cell transistors on a first side of the memory cell array; and
   a second gating circuit configured to provide at least one of the string selection signal to the string selection line and the ground selection signal to the ground selection line on a second side of the memory cell array.

3. The nonvolatile memory device of claim 2, wherein the first gating circuit and the second gating circuit are configured to provide the string selection signal to the string selection line on the first side and the second side of the memory cell array concurrently.

4. The nonvolatile memory device of claim 2, wherein the first gating circuit and the second gating circuit are configured to provide the ground selection signal to the ground selection line on the first side and the second side of the memory cell array concurrently.

5. The nonvolatile memory device of claim 2, wherein the first gating circuit and the second gating circuit are configured to provide the word line voltages to the plurality of word lines on one of the first side and the second side of the memory cell array.

6. The nonvolatile memory device of claim 2, wherein the first gating circuit comprises:
   first pass transistors configured to provide a plurality of string selection signals to a plurality of string selection lines on the first side of the at least one of selection lines in response to a block selection signal;
   second pass transistors configured to provide the plurality of word line voltages to the plurality of word lines in response to the block selection signal; and
   a third pass transistor configured to provide the ground selection signal to a ground selection line on the first side in response to the block selection signal.

7. The nonvolatile memory device of claim 6, wherein the second gating circuit comprises:
   fourth pass transistors configured to provide the plurality of string selection signals to the plurality of string selection lines on the second side in response to the block selection signal; and a fifth pass transistor configured to provide the ground selection signal to the ground selection line on the second side in response to the block selection signal.

8. The nonvolatile memory device of claim 7, wherein the first to fifth pass transistors are high voltage transistors.

9. The nonvolatile memory device of claim 2, wherein the first and second gating circuits include ground transistors configured to ground the at least one of string selection line and ground selection line in response to a block shut-off signal.

10. The nonvolatile memory device of claim 1, wherein each of the plurality of cell transistors include a charge trap layer.

11. A method of reading a nonvolatile memory device, the nonvolatile memory device including a plurality of cell strings formed in a direction perpendicular to a substrate layer, each of the plurality of cell strings including at least one selection transistor and a cell transistor, the method comprising:
   pre-charging a bit line connected to a selected cell string of the plurality of cell strings;
   applying a word line voltage to a word line of the cell transistor and applying at least one selection signal to at least one selection line connected to the at least one selection transistor on both sides of the at least one selection line to setup the at least one selection signal more rapidly than the word line voltage.

12. The method of claim 11, wherein the at least one selection transistor comprises a string selection transistor connected to a string selection line and a ground selection transistor connected to a ground selection line.

13. The method of claim 11, wherein the at least one selection transistor corresponds to a string selection transistor connected to a string selection line.

14. The method of claim 11, wherein the at least one selection transistor corresponds to a ground selection transistor connected to a ground selection line.

15. The method of claim 11, wherein the cell transistor includes a charge trap layer.

16. The method of claim 11, wherein the at least one selection line is driven by at least two driving circuit, and the word line is driven by single driving circuit.

17. A storage device, comprising:
   a nonvolatile memory device including a plurality of cell strings formed in a direction perpendicular to a substrate layer, wherein each of the plurality of cell strings are driven via at least one string selection line, a plurality of word lines, and at least one ground selection line; and
   a memory controller configured to control the nonvolatile memory device to select at least one of the plurality of cell strings at a read operation,
   wherein the at least one string selection line or the at least one ground selection line is driven in at least two directions.

18. The storage device of claim 17, wherein the nonvolatile memory device comprises:
   a first gating circuit configured to drive the at least one string selection line and the at least one ground selection line; and
   a second gating circuit configured to drive the at least one string selection line.

19. The storage device of claim 18, wherein the first gating circuit is configured to drive the plurality of word lines in single direction.

20. The storage device of claim 17, wherein the plurality of cell strings comprises a non-volatile memory that is monolithically formed in one or more physical levels of memory cells having active areas disposed above a silicon substrate.

* * * * *